(12) United States Patent
Yamamichi et al.

(10) Patent No.: US 6,524,905 B2
(45) Date of Patent: Feb. 25, 2003

(54) SEMICONDUCTOR DEVICE, AND THIN FILM CAPACITOR

(75) Inventors: Shintaro Yamamichi, Tokyo (JP); Toru Mori, Tokyo (JP); Akinobu Shibuya, Tokyo (JP); Takao Yamazaki, Tokyo (JP); Yuzo Shimada, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/903,316

(22) Filed: Jul. 11, 2001

(65) Prior Publication Data

US 2002/0025623 A1 Feb. 28, 2002

(30) Foreign Application Priority Data

Jul. 14, 2000 (JP) .................................... 2000-215061

(51) Int. Cl.⁷ .......................................... H01L 21/8242
(52) U.S. Cl. ...................... 438/240; 438/250; 438/393
(58) Field of Search ................................. 438/240, 250, 438/253, 396, 397, 398; 257/297, 298, 299, 300

(56) References Cited

U.S. PATENT DOCUMENTS

| | | | | |
|---|---|---|---|---|
| 6,027,980 A | * | 2/2000 | Gardner | 438/396 |
| 6,121,659 A | * | 9/2000 | Christensen et al. | 257/347 |
| 6,124,199 A | * | 9/2000 | Gambino et al. | 257/239 |
| 6,190,957 B1 | * | 2/2001 | Mochizuki et al. | 438/240 |
| 6,259,126 B1 | * | 7/2001 | Hsu et al. | 257/298 |
| 6,285,050 B1 | * | 9/2001 | Emma et al. | 257/296 |
| 2002/0094629 A1 | * | 7/2002 | Belleville et al. | 438/218 |

FOREIGN PATENT DOCUMENTS

| | | |
|---|---|---|
| JP | 07-022757 | 1/1995 |
| JP | 07-183459 | 7/1995 |
| JP | 07-183470 | 7/1995 |
| JP | 08-097360 | 4/1996 |
| JP | 08-321585 | 12/1996 |
| JP | 08-340090 | 12/1996 |

\* cited by examiner

*Primary Examiner*—Tuan H. Nguyen
(74) *Attorney, Agent, or Firm*—Scully, Scott, Murphy & Presser

(57) ABSTRACT

A semiconductor device provided with a thin film capacitor having a small equivalent series inductance is provided, which can be operated at a high frequency range and contributes to size reduction of the electronic devices. The semiconductor device comprises a device formed on a silicon substrate 1a, interlayer insulating films 3a, 3b, and 3c, wiring blocks including a power source wire block and a ground wire block, and a thin film capacitor 14 formed on an uppermost insulating layer. The thin film capacitor 14 comprises a lower electrode 6 connected to the ground wire block 4e through a contact 5d, an upper electrode 8 which is connected to the power source wire block 4d through a contact 5d, and which extends above the lower electrode 6, and a dielectric layer 7 which is inserted between the lower and the upper electrodes.

7 Claims, 12 Drawing Sheets

SEMICONDUCTOR DEVICE, AND THIN FILM CAPACITOR

BACKGROUND OF THE INVENTION

1. Field of the Invention

The present invention relates to a semiconductor device, a method for manufacturing the same, and a thin film capacitor, and in particular, relates to a constitution of a semiconductor device integrated with a thin film capacitor which functions as a decoupling capacitor.

2. Description of the Related Art

When a load is applied very rapidly to a semiconductor integrated circuit device (hereinafter, called an LSI), a voltage drop is observed due to a parasitic resistance and a parasitic inductance present between the power source and ground wirings of the LSI. The voltage drop becomes larger when the parasitic resistance and the parasitic inductance increases, and when the fluctuation time of the load current becomes shorter. The operational frequency has been increased recently from several hundreds of MHz to a level on the order of GHz, and the rising time of the clock has become very short, so that voltage drops have become larger, which causes malfunction of the LSI. In order to reduce such a voltage drop for such reasons, an effective measure is to dispose a capacitor between the power source line of the LSI and the ground wirings of the LSI in parallel. This capacitor disposed in parallel is generally called a decoupling capacitor. When the LSI is temporarily subjected to a voltage drop, the charge accumulated on both electrodes of the capacitor is instantaneously discharged so that the temporal drop of the source voltage can be compensated.

When an ideal state is assumed in which the equivalent series inductance and the equivalent series resistance of the decoupling capacitor is zero, it is possible to discharge the charge instantaneously, and to suppress the voltage fluctuation to zero. In practice, however, since the capacitor has a certain amount of equivalent series inductance and equivalent series resistance, an LC resonance is generated and the capacitor does not work above the resonant frequency. Therefore, as the operational frequency of the LSI increases, it is necessary to reduce the equivalent series inductance of the decoupling capacitor and to shorten the distance between the LSI and the capacitor.

Conventionally, a discrete multilayer ceramic capacitor has been used, because it has a comparatively small equivalent series inductance at a high frequency range. The discrete multilayer ceramic capacitor has a features that its equivalent series resistance and the equivalent series inductance are small when compared with an electrolytic capacitor and in practice, the equivalent series inductance can be reduced to a level of 0.4 nH for a capacitor with a capacitance of 0.01 $\mu$F. Therefore, the voltage drop has been conventionally prevented by disposing a number of multilayer ceramic capacitor around the LSI which performs a high speed operation. FIG. 13 shows a conventional example, in which a number of multilayer ceramic capacitors 13 functioning as decoupling capacitors are mounted around the LSI chip 12 mounted on a printed circuit board 11.

Conventional examples, in which decoupling capacitors are disposed at the nearest positions to the LSI, are disclosed in Japanese Unexamined Patent Application, First Publications No. Hei 7-183470 and No. Hei 7-183459. In these conventional examples, the decoupling capacitors are adhered to the upper surface of the LSI using a conductive adhesive.

Accordingly, manufactures of the conventional semiconductor integrated circuits used to provide a plurality of types of LSIs, the operational frequency of each of which was guaranteed, for the convenience of customers' selection, or manufacturers often manufactured LSIs in accordance with customer designs.

When the performance of a capacitor is considered, the resonant frequency of the above-described discrete multilayer ceramic capacitor is at a level of approximately 80 MHz, so that the multilayer ceramic capacitor cannot compensate for the voltage drop of the LSIs which are operated at several hundreds of MHz or on the order of GHz. Furthermore, the decoupling capacitors arranged shown in FIG. 13 occupy a considerable area of the printed circuit board, so that such arrangement is disadvantageous in reducing the size of the electronic devices.

The method of adhering a capacitor on the surface of an LSI as disclosed in Japanese Unexamined Patent Application, First Publications No. Hei 7-183470 and No. Hei 7-183459 cannot cope with operations in a higher frequency range of more than several hundreds of MHz because of the resistance of the adhesive and contact resistance of the capacitor with the LSI, and because of the presence of an inductance component resulting from the shape of the adhesive.

The fact that the equivalent series inductance of the decoupling capacitor can be decreased by decreasing the thickness of the dielectrics constituting the capacitor has been known. Although the thickness of the dielectric layers in the discrete multilayer ceramic capacitors are generally on the order of a micronmeter, the thickness of the dielectric layers in the thin film capacitor used inside of the LSI is on the order of a nanometer, so that the equivalent series inductance is quite small and the decoupling capacitor is operable in the GHz frequency range.

In particular, when a dielectric film is used such as (Ba, Sr)TiO$_3$ having a higher dielectric constant than SrTiO$_3$ which has the high dielectric constant of 300 at room temperature, it is possible to increase the charge stored per a unit area to more than several tens of times than the SiO$_2$ or Si$_3$N$_4$. This is because the dielectric constants of the SrTiO$_2$ or (Ba, Sr)TiO$_3$ are 300 to 500 or more, while the dielectric constants of SiO$_2$ and Si$_3$N$_4$ are 3.9 and 7.

An example of forming a decoupling capacitor on an aluminum nitride using a SrTiO$_3$ film deposited by sputtering as a dielectric material is disclosed in Japanese Unexamined Patent Application, First Publication No. Hei 8-97360. However, in this example, the decoupling capacitor was formed on the printed circuit board for mounting a multi-chip module, so that the deposition temperature for depositing SrTiO$_3$ is limited. In general, it is known that the dielectric constant becomes high when this type of dielectric material is formed at high temperature. Thus, the dielectric film formed at a limited temperature cannot have a high dielectric constant, which can be provided if the deposition is performed at higher temperature range.

When a manufacturer stores a variety of types of LSI having different operational frequencies in order to meet customer demand, some types of LSI will be stored and will not be ordered and some types will be ordered in excess of what is stored, which incurs high prices for some customers and low profits for the manufacturer. On the other hand, when the manufacturer cooperates in designing an LSI with a customer, if the customer wishes to change the design in the operating frequency or to reduce the price after the design is completed, the manufacturer and the customer will both suffer from delay of delivery and increased cost.

SUMMARY OF THE INVENTION

The present invention is made to solve the above problems and an object of the present invention is to provide a thin film capacitor as a decoupling capacitor having a lower equivalent series inductance than that of the conventional discrete multilayer ceramic capacitor. An object of the present invention is to provide a semiconductor device, which is capable of being operated at a higher operational frequency range, capable of being mounted in a reduced area, and capable of being manufactured at a reduced cost and with a reduced delivery time.

According to the first aspect, a semiconductor device comprises: a plurality of elements formed on a semiconductor substrate; an interlayer insulating film covering the plurality of elements; a plurality of wiring blocks including a power source wire block and a ground wire block connected to the plurality of elements; an uppermost insulating film which covers these wiring blocks; and a thin film capacitor formed on the uppermost insulating film; wherein the thin film capacitor comprises at least one set of: a lower electrode, which is electrically connected to either one of the power source wire block and the ground wire block through a contact passing through the uppermost insulating film; an upper electrode, connected to either one block which is not connected to the lower electrode among the power source wire block and the ground wire block, and at least a portion of the upper electrode extends above the lower electrode; and a dielectric layer which is put between the lower electrode and the upper electrode.

In the present semiconductor device, the power source wire and the ground wire of the integrated circuit portion are connected to respective electrodes of the thin film capacitor through contacts, which pass through the uppermost insulating layer. Thus, the distance between the power source wire and one electrode of the thin film capacitor, or a distance between the ground wire and another electrode of the thin film capacitor is as low as the thickness of the uppermost insulating layer. Accordingly, the distance between the power source wire or the ground wire and both electrodes of the thin film capacitor of the present invention is far lower when compared with the distance of the conventional multilayer ceramic capacitor to the LSI mounted on a printed circuit board. Consequently, in addition to the effect of making the dielectric layer thin, a decoupling capacitor is provided which has a very small equivalent series inductance and very small equivalent series resistance. In addition, since the thin film capacitor which functions as a decoupling capacitor is united with the signal processing portion (LSI) by integrating the thin film capacitor on the LSI, so that any particular area is not required for this capacitor integrated LSI and this thin film capacitor integrated LSI contributes to the size and weight reduction of the electronic devices.

In a semiconductor device, the upper electrode is not disposed above the contact for electrically connecting the lower electrode to any one of the power source wire block or the ground wire block.

If the top surfaces of the contact become not flat, and if the lower electrode surface becomes rough, thus even if the film thickness of the dielectric layer becomes locally thin, it is possible to prevent an increase in the leakage current or the breakdown of the dielectric layer if the upper electrode is not disposed on the locally thin dielectric layer.

The thin film capacitor of the present invention is preferably constituted by one set of the multilayer structure composed of the lower electrode, the dielectric layer, and the upper electrode.

The thin film capacitor of the present invention may be constituted by a plurality of a multilayer structure composed of a lower electrode, a dielectric layer, and an upper electrode. However, the increase in the number of the multilayer structures causes an increase in the equivalent series inductance of the capacitor, and the thin film capacitor comprised of one multilayer structure is preferable.

The materials constituting at least a part of the dielectric layer include compounds expressed by the general chemical formula of $ABO_3$, wherein A is at least one element selected from the group consisting of Ba, Sr, Pb, Ca, La, Li, and K; and B is at least one element selected from the group consisting of Zr, Ti, Ta, Nb, Mg, Mn, Fe, Zn, and W; or compounds expressed by the chemical formula $(Bi_2O_3)(A_{m-1}B_mO_{3m+1})$ (m=1, 2, 3, 4, 5), in which A is at least one element selected from the group consisting of Ba, Sr, Pb, Ca, K, and Bi; and B is at least one element selected from the group consisting of Nb, Ta, Ti, and W, or $Ta_2O_5$.

Since these materials exhibit far larger dielectric constants than those of $SiO_2$ or $Si_3N_4$, these materials make it possible to increase the storage capacity density and to decrease the size of the thin film capacitor.

A manufacturing method for a semiconductor device comprises at least one set of a multilayer capacitor composed of a lower electrode, a dielectric layer, and an upper electrode on a first semiconductor electrode, comprising the steps of: forming a thin film capacitor, in which at least a part of the lower electrode and the upper electrode is exposed; forming a plurality of elements on a second semiconductor substrate; forming a interlayer insulating film covering those elements; forming on the interlayer insulating film a plurality of wiring blocks including a power source wire block and a ground wire block connected to the plurality of elements; forming a uppermost insulating layer covering the plurality of wiring blocks; forming contacts, which respectively connecting to the power source wire block and the ground wire block, and which pass through the upper most insulating film; forming connecting portions on the uppermost insulating layer corresponding to a region where the contacts are respectively formed; connecting the exposed portion of the lower electrode to one of the contacts and connecting the exposed portion of the upper electrode to the remaining contacts while positioning a surface for forming the thin film capacitor on the first semiconductor substrate and the uppermost insulating layer of the semiconductor device on the second semiconductor substrate so as to face each other; and removing at least a portion of the first semiconductor substrate while leaving the thin film capacitor on the side of the second semiconductor substrate.

According to the manufacturing method for a semiconductor device of the present invention, the thin film capacitor is formed on a first substrate separately from the integrated circuit portion formed on a second substrate, so that dielectric layer of the thin film capacitor can be formed at a high temperature without being affected by the thermally durable temperature of the integrated circuit portion. As a result, the capacitor performance is increased and the size of the thin film capacitor can be reduced.

In a manufacturing method for the above semiconductor device, when forming the thin film capacitor on the first silicon substrate, hydrogen ions are implanted into the first silicon substrate, and when removing at least a portion of the first semiconductor substrate while leaving the thin film capacitor, the first silicon substrate is separated leaving the region wherein hydrogen ions were implanted.

A manufacturing method for a semiconductor device of the present invention comprises the steps of: forming at least one set of a multilayer structure comprising a lower electrode, a dielectric layer, and an upper electrode on a resin film for manufacturing a thin film capacitor, in which at least a part of the lower electrode and the upper electrode is exposed; forming a plurality of elements on a semiconductor substrate; forming an interlayer insulating film for covering the plurality of elements; forming on the interlayer insulating film a plurality of wiring blocks including a power source wire block and a ground wire block connected to the plurality of elements; forming an uppermost insulating layer covering the plurality of wiring blocks; forming contacts, which respectively connecting to the power source wire block and the ground wire block, and which pass through the uppermost insulating film; forming connecting portions on the uppermost insulating layer corresponding to a region where the contacts are respectively formed; connecting the exposed portion of the lower electrode to one of the contacts and connecting the exposed portion of the upper electrode to the remaining contacts while positioning a surface for forming the thin film capacitor on the resin film and the uppermost insulating layer of the semiconductor device on the second semiconductor substrate so as to face each other; and removing at least a portion of the resin film while leaving the thin film capacitor on the side of the semiconductor substrate.

The manufacturing method for a semiconductor device of the present invention is, similar to the above-described method, capable of producing the thin film capacitor on the resin film separately from the integrated circuit portion formed on a silicon substrate, so that high capacitor performance can be obtained. In order to deposit the dielectric film such as $SrTiO_3$ at high temperature, it is preferable for the resin film having a high thermal durability so as to be able to deposit the dielectric film having a higher dielectric constant higher than those of $SiO_2$ or $Si_3N_4$. Furthermore, this manufacturing method makes it possible to mass produce the thin film capacitor on inexpensive thin resin films, so that the manufacturing cost of the decoupling capacitor can be markedly reduced.

The other manufacturing method for a semiconductor device, which comprises the steps of forming a general purpose signal-processing portion by forming a plurality of elements on a semiconductor substrate; forming a interlayer insulating film which covers the plurality of elements; forming on the interlayer insulating film a plurality of wiring blocks including a power source wire block and a ground wire block connected to the plurality of elements; forming a uppermost insulating layer covering the plurality of wiring blocks; and forming contacts, which respectively connecting to the power source wire block and the ground wire block, and which pass through the uppermost insulating film; and the manufacturing method further comprises the step of: forming on the uppermost layer a thin film capacitor which is designed so as to conform with the desired operational frequency of the general purpose signal processing portion.

According to the above manufacturing method, the general purpose semiconductor integrated circuits are manufactured and stored beforehand, so that the manufacturing cost of the semiconductor integrated circuit can be reduced and the semiconductor device which has the same operation frequency as that of the customer's demand can be shipped within a short delivery time.

The thin film capacitor of the present invention, which is formed on the uppermost insulating layer of a semiconductor device comprises a plurality of elements, an interlayer insulating film covering the plurality of elements, a plurality of wiring blocks including a power source wire block and a ground wire block, which are electrically connected to the plurality of elements, and an uppermost insulating layer covering the wiring blocks; wherein, the thin film capacitor is formed by at least a set of a multilayer structure comprising: a lower electrode which is electrically connected to one of the power source wire block or the ground layer block through a contact which passes through the uppermost insulating layer; an upper electrode which is electrically connected to any one of the power source wire block or the ground wire block which is not connected to the lower electrode, and at least a portion of which extends above the lower electrode; and a dielectric layer, which is inserted between the lower electrode and the upper electrode.

The thin film capacitor of the present invention can be connected with the power source wire or the ground wire at a very small distance so that the parasitic inductance and the equivalent series resistance of the thin film capacitor can be reduced drastically in addition to the effect of forming the dielectric material into a thin film.

The above thin film capacitor according to the present invention is preferably sealed by a resin.

The thin film capacitor may be sealed with a sealant of a resin after connecting the thin film capacitor and the integrated circuit formed on the semiconductor substrate. In contrast, the thin film capacitor may be connected with the integrated circuit portion after sealing the lower electrode and the upper electrode with a photosensitive resin except each portion of the lower electrode and the upper electrode.

DETAILED DESCRIPTION OF THE INVENTION

First Embodiment

Hereinafter, a first embodiment of the present invention will be described with reference to FIGS. 1 and 2.

Figure 1:
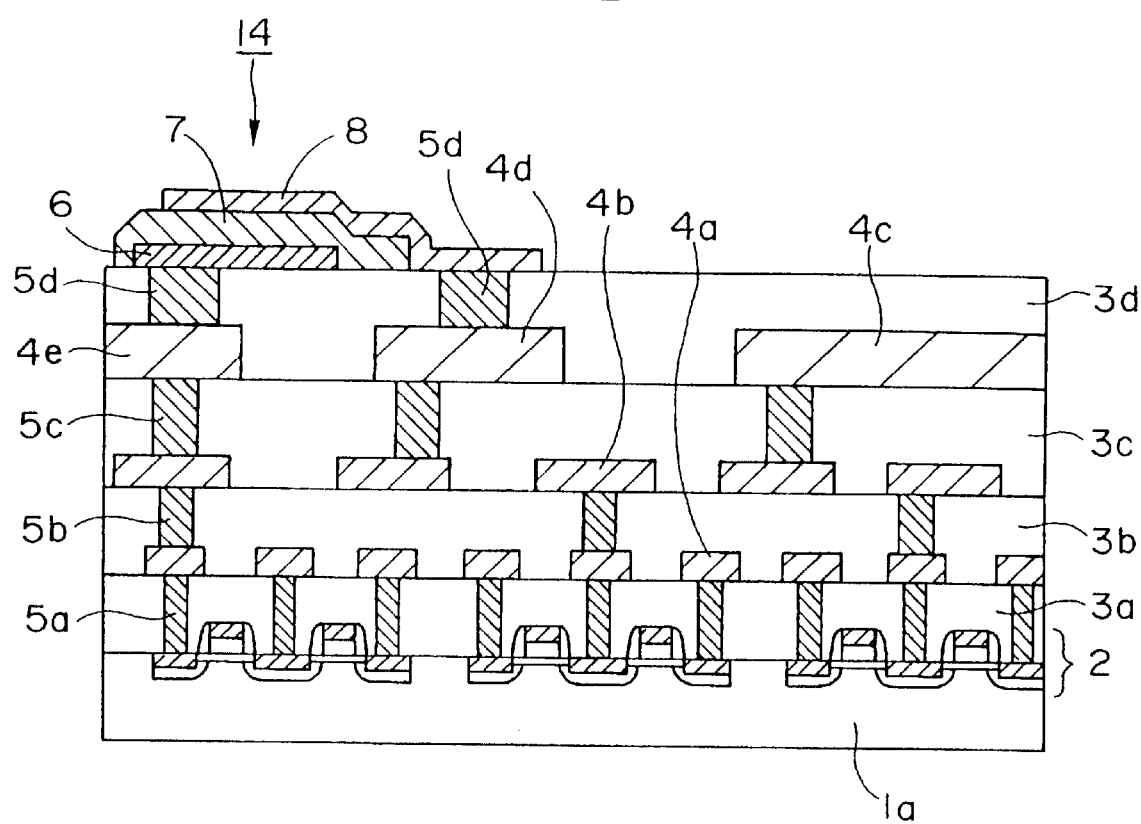
FIG. 1 is a cross-sectional view showing a semiconductor integrated circuit and a thin film capacitor according to the first embodiment of the present invention.

FIG. 1 is a cross-sectional view of a semiconductor integrated circuit including a signal processing portion (integrated circuit portion) and a thin film capacitor according to the first embodiment of the present invention.

As shown in FIG. 1, a signal processing circuit (integrated circuit portion) composed of a plurality of devices such as transistors and thin film capacitors is formed on a silicon substrate 1a. On the signal processing circuit, a first interlayer insulating film 3a made of a main component of $SiO_2$ is formed, and the device 2 and the first wiring layer 4a are connected by a contact 5a through the first interlayer insulating film 3a. Furthermore, a second interlayer insulating film 3b and the second wiring layer 4b are formed on the first wiring layer 3a and the first wiring layer 4a and the second wiring layer 4b are connected by a contact 5b through the second interlayer insulating film 3b. Similarly, the second wiring layer 4b and a third wiring layer 4c are connected by a contact 5c through a third interlayer insulating film 3c. In this embodiment, a three layer structure is adopted and the uppermost wiring layer of the signal processing circuit is the wiring layer of 4c. Examples of materials for forming respective layers includes WSi for the first wiring layer 4a, Cu/TaN/Ta or Al/TiN/Ti for the second and third wiring layers, W/TiN/Ti for contacts 5a and 5b, and Cu/TaN for contacts 5c and 5b.

On the uppermost wiring layer 4c, a fourth interlayer insulating layer 3d (uppermost insulating film layer) is formed, and on the fourth interlayer insulating film 3d, a thin film capacitor 14 functioning as a decoupling capacitor is formed. Among a plurality of uppermost wiring layer blocks 4c, the ground wire 4e and the power source wire 4d are connected to the lower electrode 6 and the upper electrode 8 of the thin film capacitor 14, respectively. An example of the dielectric material 7 for the thin film capacitor 14 is $SrTiO_3$, and the lower and upper electrodes 6 and 8 of the thin film capacitor 14 are made by, for example, Pt films. The thickness of the fourth interlayer insulating film 3d formed on the power source wire 4d and the ground wire 4e is originally thinner than that of the fourth interlayer insulating film. In some cases, when the contacts 5d are not completely embedded in the insulating layer, the lower electrode 6 and the upper electrode 8 are deformed into a downwardly convex shape. By forming the above-described structure, the distances between the lower and upper electrodes of the decoupling capacitor and the power source wire 4d and the ground wire 4e of the signal processing circuit (LSI) can be reduced to less than the thickness of the third interlayer insulating film 3d, so that the equivalent series inductance and the equivalent series resistance can be remarkably reduced when compared to the conventional capacitor. In addition, since the decoupling capacitor is united with the LSI, no area is needed for the decoupling capacitor when it is mounted on a printed circuit board.

Figure 2:
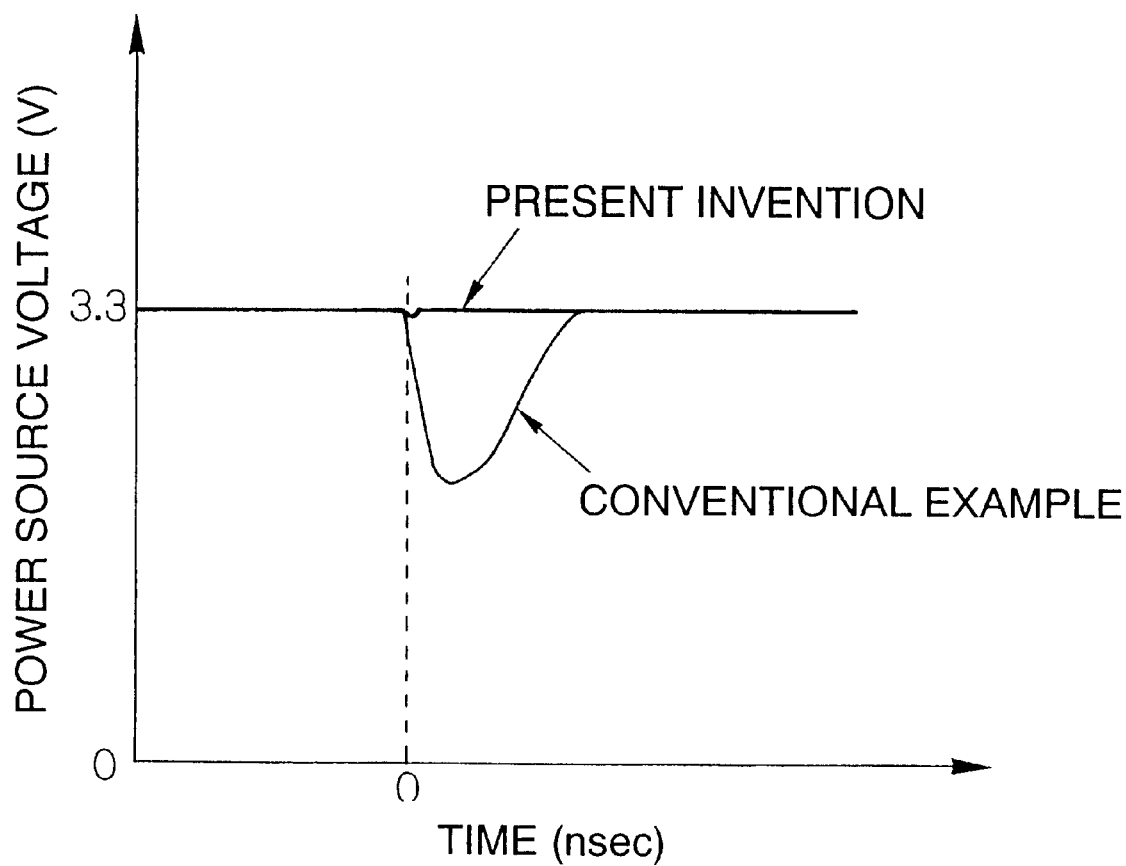
FIG. 2 is a diagram showing the suppression effect of the source voltage change of the decoupling capacitor of the present invention when compared to the source voltage change of the conventional decoupling capacitor.

FIG. 2 is a diagram showing the suppression effect of the source voltage change of the decoupling capacitor of the present invention when compared to the source voltage change of the conventional multilayer ceramic capacitors arranged around the LSI. The source voltage is 3.3 V, the operational frequency of the LSI is 500 MHz, and the maximum load current is 18 A. Specifications of the conventional capacitors and the capacitor according to the present inventions are shown in Table 1.

TABLE 1

|   | Conventional Capacitor | Capacitor of the present invention |
|---|---|---|
| Capacitor size (W × D × T) | 1.0 × 0.5 × 0.5 mm | 1.0 × 0.5 × 0.001 mm |
| Materials for capacitors | Pb type ceramics | Thin films of SrTiO3 |
| Unit Capacitance | 0.010 μF | 0.012 μF |
| Number of capacitors | 60 pieces | 60 pieces |

The thin film capacitor integrated LSI shows a very small change in the power source voltage and the change is disappears within a short time.

Second Embodiment

Figure 3:
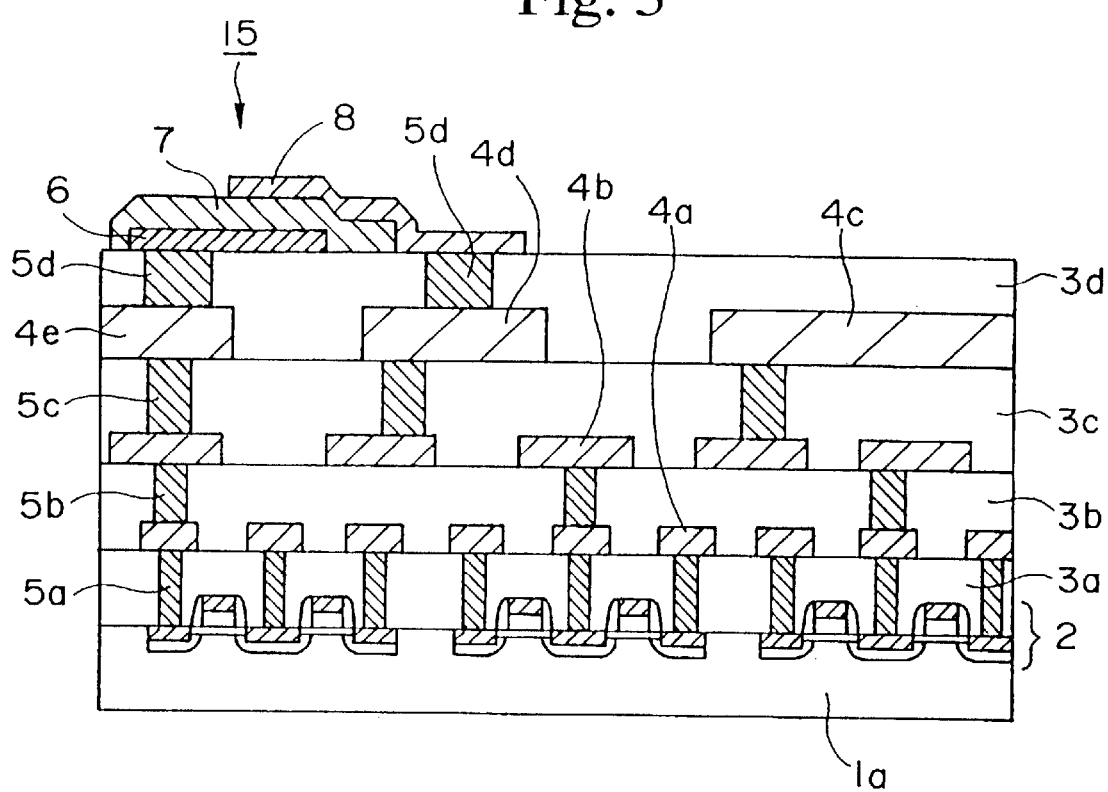
FIG. 3 is a cross-sectional view showing a semiconductor integrated circuit and a thin film capacitor according to the second embodiment of the present invention.

FIG. 3 is a cross-sectional view showing a semiconductor device including the integrated circuit portion and the capacitor portion according to the second embodiment of the present invention.

As shown in FIG. 3, a signal processing circuit is formed by a plurality of devices 2 such as transistors and thin film capacitors on a silicon substrate 1a. An interlayer insulating film 3a made of a main component of $SiO_2$ and the first wiring layer 4a is formed on the signal processing circuit, and the devices 2 and the first wiring layer 4a is connected by a contact 5a. On the first wiring layer, the second wiring layer 4b is formed on the second interlayer insulating layer 3b and the first wiring layer 4a and the second wiring layer 4b are connected by a contact 5b through the second interlayer insulating film 3b. Similarly, the third wiring layer 4c is formed on the third interlayer insulating film 4c and the third wiring layer 4c and the second wiring layer 4b are connected by a contact 5c. In this embodiment, the uppermost wiring layer of the signal processing circuit is the wiring layer of 4c.

The fourth interlayer insulating film 3d is formed on the uppermost wiring layer 4c, and a thin film capacitor 15 is formed on the fourth interlayer insulating film 3d. Each of the third wiring layer blocks 4c and 4e is connected to the lower electrode 6 and the upper electrode 8 of the thin film capacitor 14, respectively, by each contact 5d. The dielectric material used in the thin film capacitor is, for example, $SrTiO_3$ and the lower and upper electrodes 6 and 8 of the capacitor are formed of, for example, Pt.

In the present embodiment, there is no upper electrode 8 on the region where the lower electrode 6 and the contact 5d are disposed. In general, the upper surface of the contact 5d is not flat, but is uneven, so that the lower electrode surface becomes an irregular surface. When the dielectric film is thinner than 0.5 μm, the thickness of the lower electrode becomes locally thin, which results in causing an increase of the leakage current or in loss of long-term reliability due to dielectric breakdown within a short service time. However, as in the case of the present embodiment, when the upper electrode is not present on the plane where the lower electrode 6 and the contact 5d are present, even when a thin region is locally generated in the area where the lower electrode 6 and the contacts are in contact, the local thin region does not function as a capacitor so that the increase of the current or the dielectric breakdown can be eliminated. In other words, the thickness of the capacitor can be made thinner than that that of the capacitor in the first embodiment, so that it is possible to increase the storage capacitance density and to yield a particular effect to be able to further suppress the voltage drop. Although not shown in the figure, the effect of suppressing the voltage change, similar to that shown in FIG. 2, was confirmed by the structure of the second embodiment.

Third Embodiment

FIGS. 4A, 4B, 5C, and 5D are cross-sectional views showing a manufacturing process of a semiconductor device including a semiconductor integrated circuit and a thin film capacitor according to the third embodiment of the present invention. In the third and fourth embodiments, the thin film capacitor is attached to the rear side of the substrate such that the capacitor is oriented downward after forming the integrated circuit oriented upward. Therefore, in the following description of the third and fourth embodiments, an electrode oriented downward is called a "lower electrode", and the electrode located close to the substrate is called an "upper electrode".

Figure 4A:
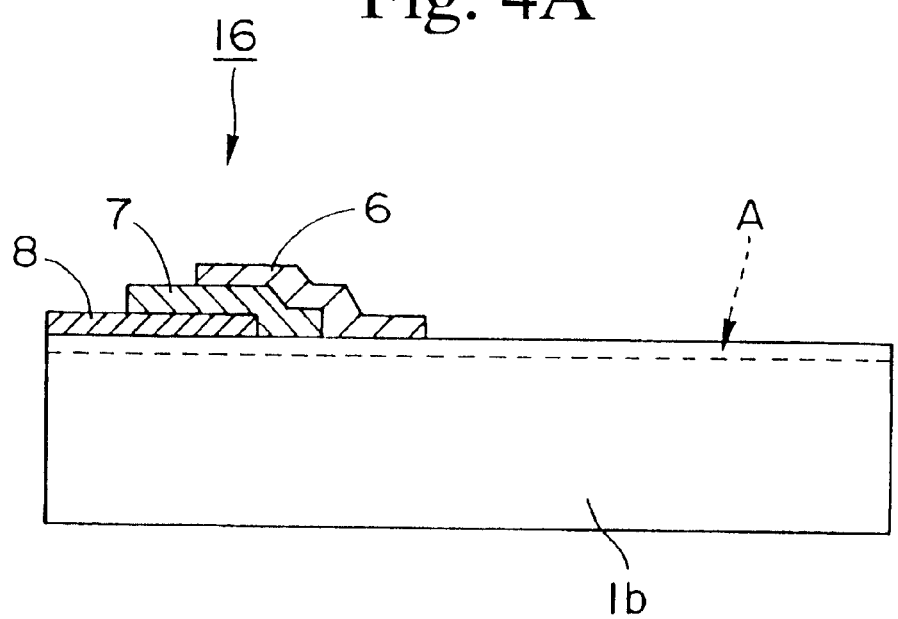
FIGS. 4A and 4B are cross-sectional views showing a semiconductor integrated circuit and a thin film capacitor according to the third embodiment of the present invention.

As shown in FIG. 4A, hydrogen is implanted into a region (the boundary is shown by the symbol A) within a certain depth from a surface of a silicon substrate (first semiconductor substrate) and a platinum upper electrode 8, a high dielectric constant film 7 of SrTiO$_3$, and a platinum lower electrode 6 is formed in sequence and is processed to a desired shape so as to form a thin film capacitor 16 used as a decoupling capacitor afterward. At this time, since the integrated circuit portion is not yet formed on the opposite side of the substrate, the dielectric film of SrTiO$_3$ can be deposited at temperatures of more than 400° C., the dielectric constant as high as 300 is obtained which corresponds to the dielectric constant of the bulk ceramics of SrTiO$_3$.

Figure 4B:
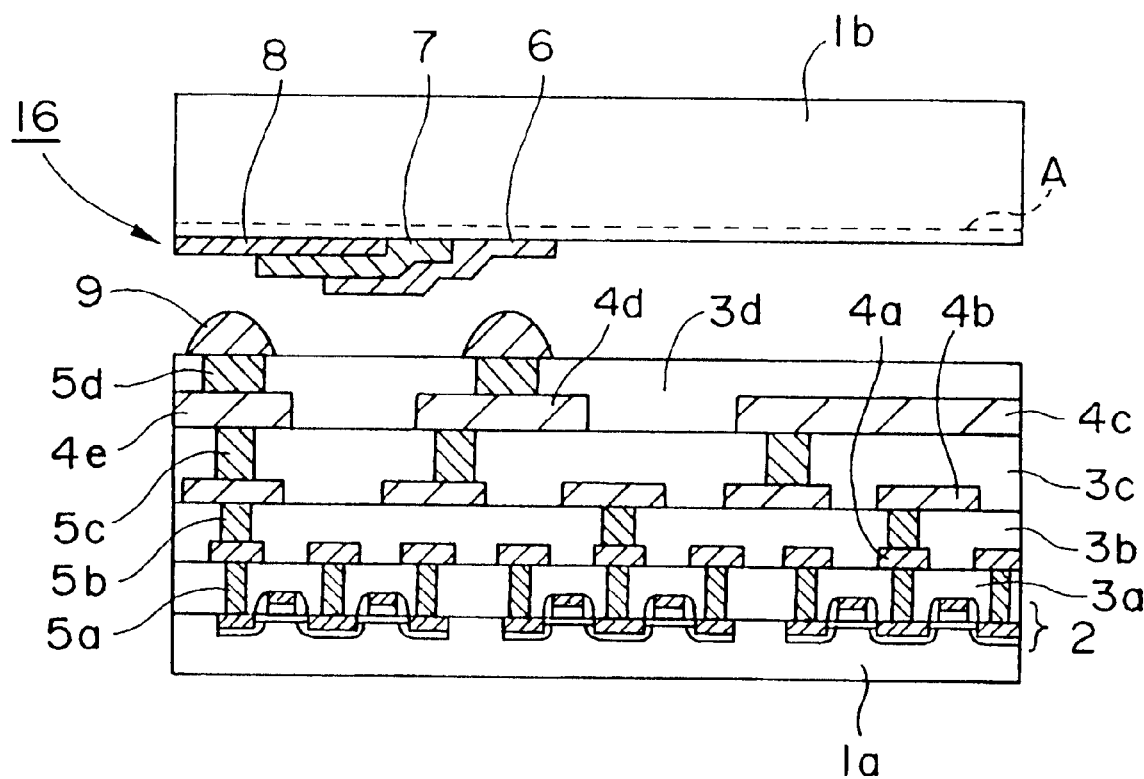

Next, as shown in FIG. 4B, similar to the structure described in the first and second embodiments, on a silicon substrate 1a (second semiconductor substrate), contacts 5d are formed for connecting the power source wire 4d and the ground wire 4e on the half-finished LSI before connecting the decoupling capacitor. Bumps (connecting portions) 9 are formed on each contact. Various materials such as a solder (Pb—Sn) or a lead free solder (Ag—Sn) are used for forming bumps.

Figure 5C:
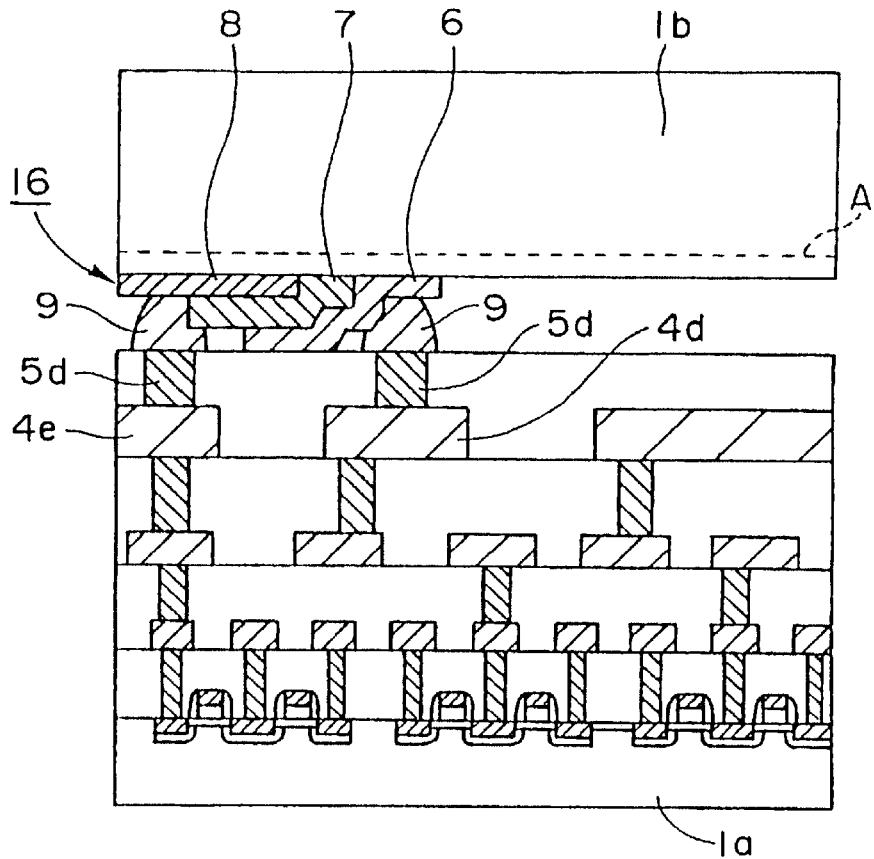
FIGS. 5C and 5D are cross-sectional views of a semiconductor integrated circuit and a thin film capacitor according to the third embodiment of the present invention.

As shown in FIG. 5C, the top surface of the thin film capacitor formed on the silicon substrate 1b and the top surface of the integrated circuit portion formed on the silicon substrate are disposed so as to face each other. The exposed part of the lower electrode of the thin film capacitor 16 and the contact 5d and the exposed part of the upper electrode of the thin film capacitor and the contact 5d are respectively aligned and then they are connected to each other through the bumps. During connection, a flux is coated on the bump, and the solder is melted by maintaining the bumps 9 in a reducing furnace at 230° C. for 30 seconds and the connection by the solder is formed, and then the flux was washed and removed. The connection by the solder may be carried out without using the flux. By the above-described process, the upper electrode 8 and the lower electrode 6 of the thin film capacitor 16 are connected to the power source wire block 4d and the ground wire block 4e, respectively, through these bumps.

Figure 5D:
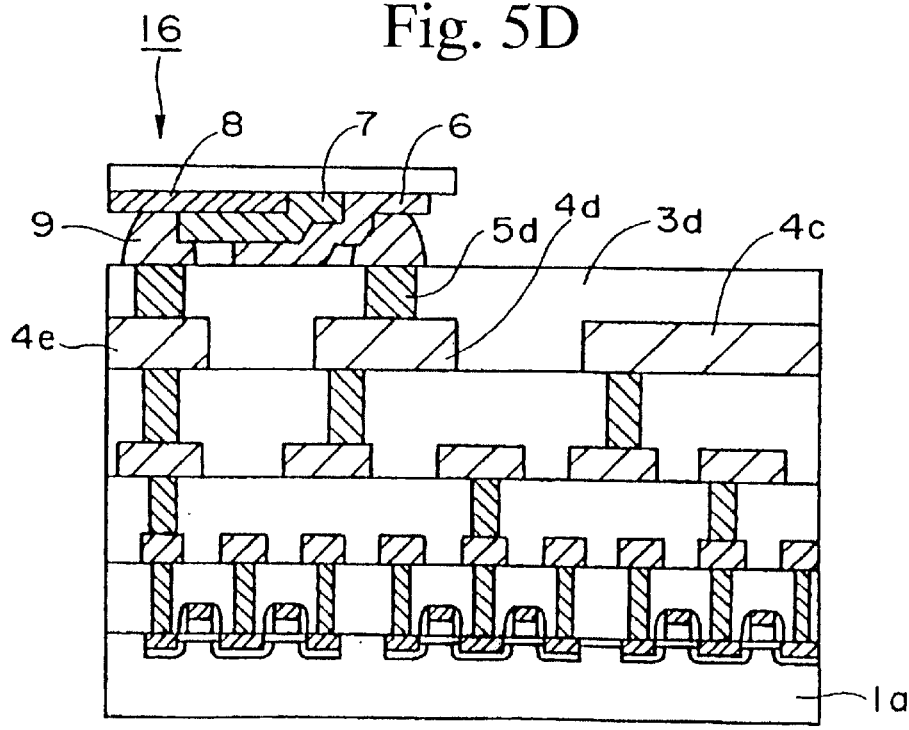

Finally, as shown in FIG. 5D, the silicon substrate 1b is separated leaving the hydrogen implanted surface layer from the boundary A, and the thin film capacitor 16 is finally installed on the uppermost layer of the LSI. The separation of the hydrogen implanted layer is carried out by a heat treatment at approximately 400° C. or by injecting a water jet stream at the boundary A. From the point of view of avoiding the thermal effect on the LSI and the thin film capacitor, it is preferable to adopt a physical separation method such as by injecting the water jet stream. As described above, the thin dielectric film for the decoupling capacitor can be deposited in a high temperature range so that the storage capacitor density of the dielectric film can be increased. In the present embodiment, the effect of suppressing the voltage change as shown in FIG. 2 is also confirmed.

Fourth Embodiment

FIGS. 6A, 6B, 7C, and 7D are cross-sectional views explaining the manufacturing process for the semiconductor device including a semiconductor integrated circuit and a thin film capacitor according to the fourth embodiment of the present invention.

Figure 6A:
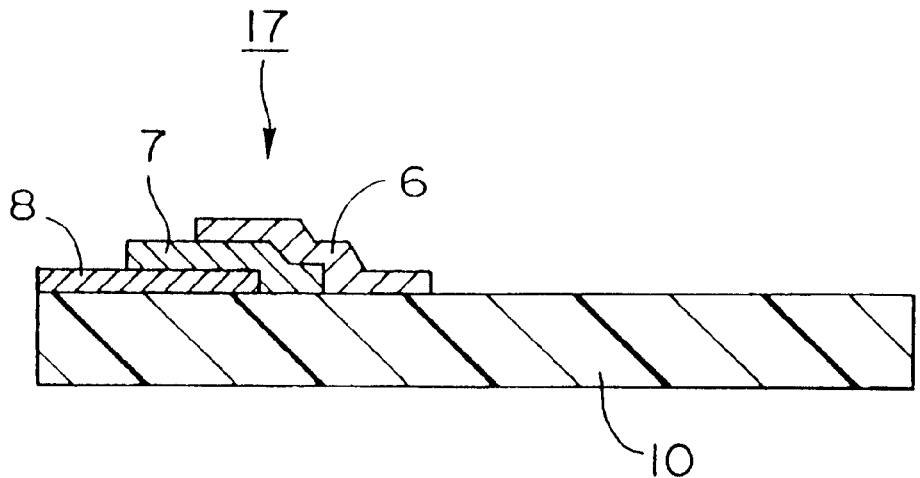
FIGS. 6A and 6B are cross-sectional views showing a semiconductor integrated circuit and a thin film capacitor according to the fourth embodiment of the present invention.

As shown in FIG. 6A, an upper electrode 8 made of platinum, a high dielectric constant film 7 made of SrTiO$_3$, and a lower electrode made of platinum are formed in sequence on a surface of an organic film 10, and after being formed into a desired shape for fabricating a thin film capacitor 17 such that they are later used as the decoupling capacitor. A highly thermally durable film such as a polyimide film is used as the organic thin film 10. Thereby, it becomes possible to deposit the high dielectric SrTiO$_3$ film at a temperature as high as 300° C., so that a high dielectric constant as high as 200 can be obtained.

Figure 6B:
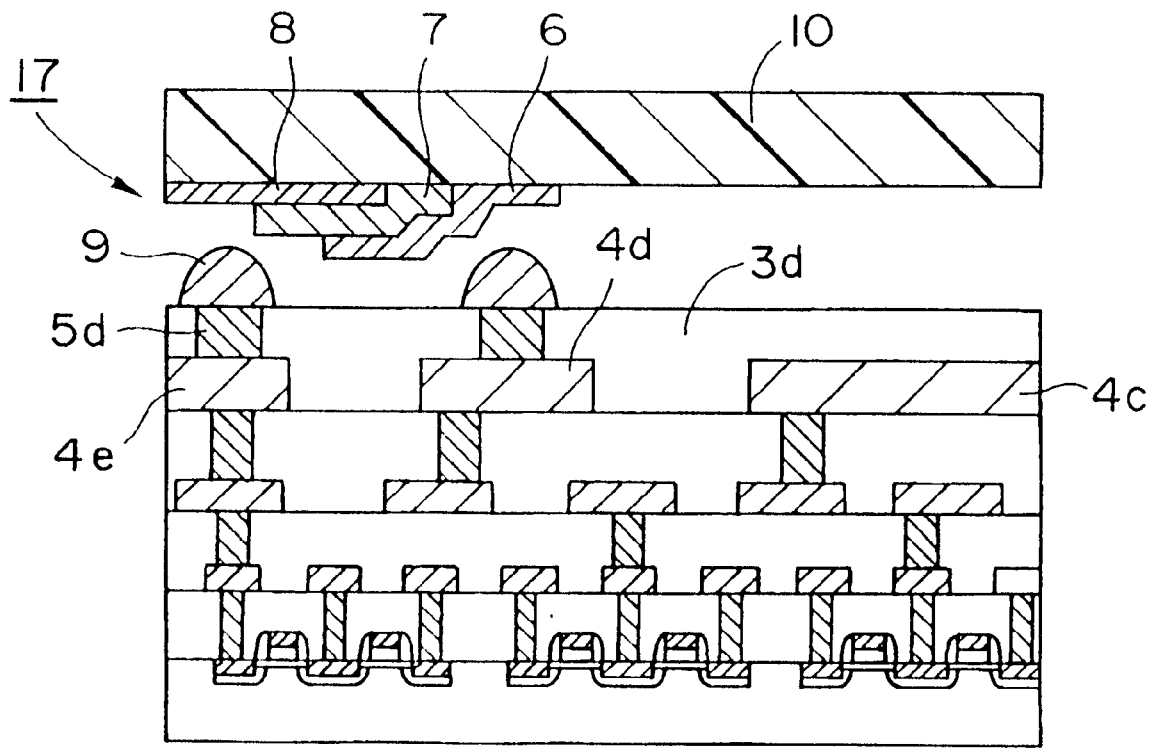

Subsequently, as shown in FIG. 6B, similarly to the third embodiment, contacts 5d are formed for connecting to the power source wire block 4d and the ground wire block 4e of the half-finished LSI until finishing formation of the uppermost wiring layer 4c and the fourth interlayer insulating layer 3d. Bumps 9 are formed on these contacts 5d.

Figure 7C:
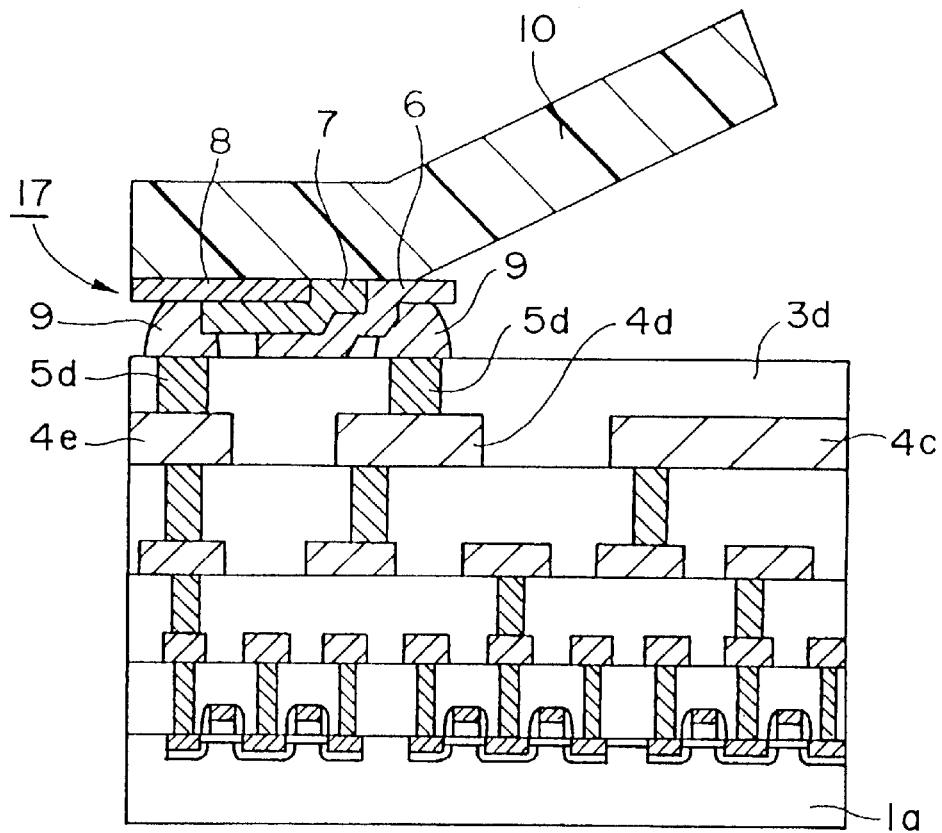
FIGS. 7C and 7D are cross-sectional views showing a semiconductor integrated circuit and a thin film capacitor according to the fourth embodiment of the present invention.

Subsequently, as shown in FIG. 7C, the thin film semiconductor surface formed on the organic film 10 and the top surface of the integrated circuit portion formed on the silicon substrate 1a are disposed so as to face to each other, and the exposed part of the lower electrode 6 of the thin film capacitor and the contact 5d, and the exposed part of the upper electrode 8 of the thin film capacitor 17 are aligned, respectively, and are connected through the bumps 9. Thereby, the lower electrode 6 and the upper electrode 8 of the thin film capacitor 17 are respectively connected to the power source wire block 4d and the ground wire block 4e through bumps.

Figure 7D:
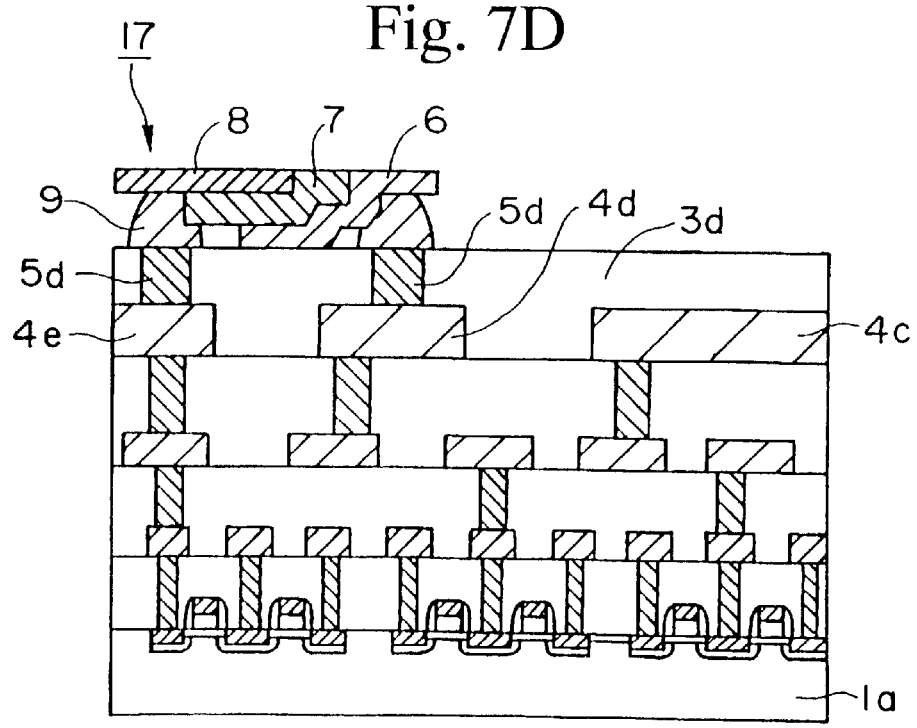

Finally, as shown in FIG. 7D, the thin film capacitor 17 is installed on the uppermost layer of the LSI by tearing off the organic film 10. The organic film 10 can be cut and removed by use of a cutter or a dicing saw blade. If the adhesive force between the electrodes and the organic film is weak, it is possible to remove the organic film simply by pulling the organic film 10. By adopting such a manufacturing process, it is possible to produce decoupling capacitors on inexpensive organic films separately from the production of LSIs at reduced cost. Note that the organic film 10 may be peeled off completely or a part of the film may be left only on the thin film capacitor. An effect for suppressing the change of the power source voltage was confirmed similar to that shown in FIG. 2 for the product manufactured according to this embodiment.

Figure 8:
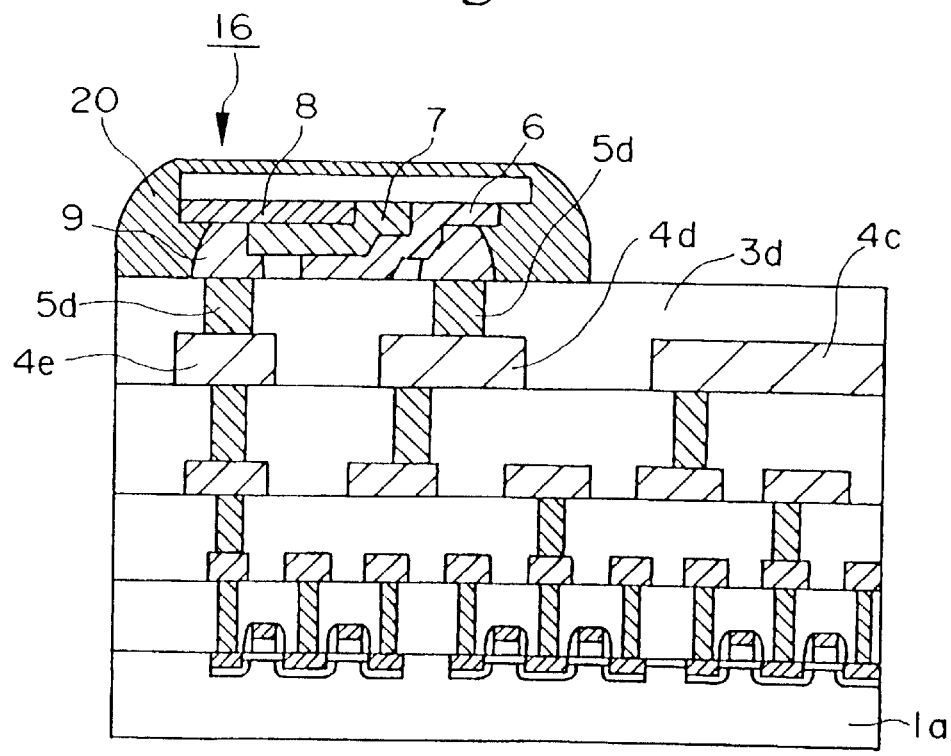
FIG. 8 is a diagram showing an example of the structure of the thin film capacitor after it is sealed.

In addition, as shown in FIG. 5D, the thin film capacitor 17 may be sealed using a sealant such as a resin. FIG. 8 shows an example in which the entire thin film capacitor 17 is sealed by an epoxy type sealant 20. In this case, after the thin film capacitor 17 and the LSI are connected, the epoxy resin type sealant is poured on and around the thin film capacitor 17, and the sealing structure shown in FIG. 8 can be obtained by curing the epoxy resin at 80 to 150° C. for one to three hours.

Figure 9:
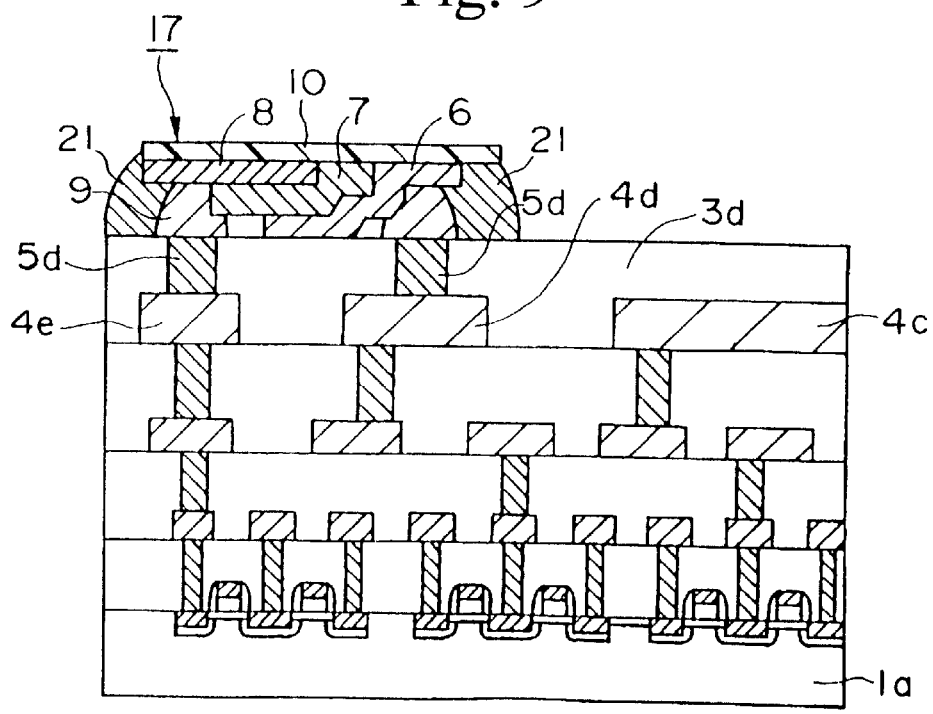
FIG. 9 is a diagram showing another example of the structure of the thin film capacitor after it is sealed.

FIG. 9 shows an example in which only the periphery of the thin film capacitor between the thin film capacitor and the LSI of the semiconductor device is sealed by the sealant 21. In this case, as shown in FIG. 1A, an area of the thin film capacitor 17 on an organic film 10 except spaces of the lower electrode 6 and the upper electrode 8 to be connected to the bumps of the contacts 5d is covered by patterning using photosensitive adhesive resins 21 a such as an epoxy-type resin or a fluorene-type resin. Subsequently, as shown in FIG. 10B, the thin film capacitor is connected to the LSI, and after curing at 150° C. for approximately one hour, the sealing structure shown in FIG. 9 is obtained by removing the organic film 10 (although a part of the organic film 10 is left in the example shown in FIG. 9).

Figure 10A:
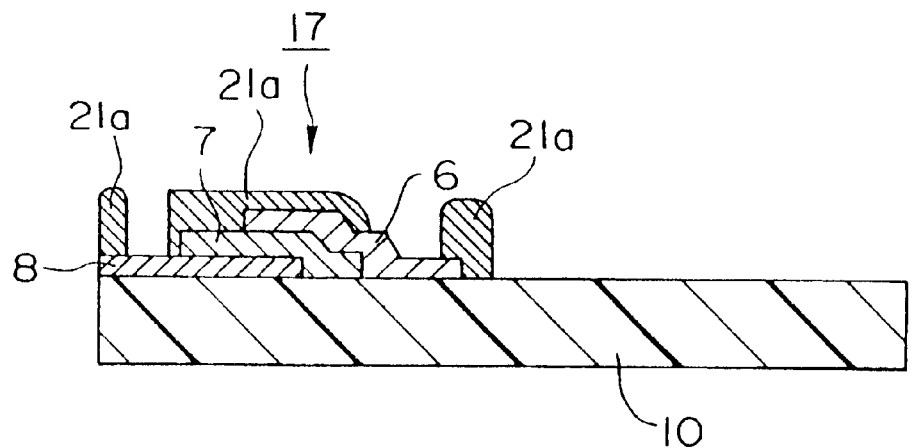
FIGS. 10A and 10B are diagrams explaining a method for sealing the thin film capacitor.
Figure 10B:
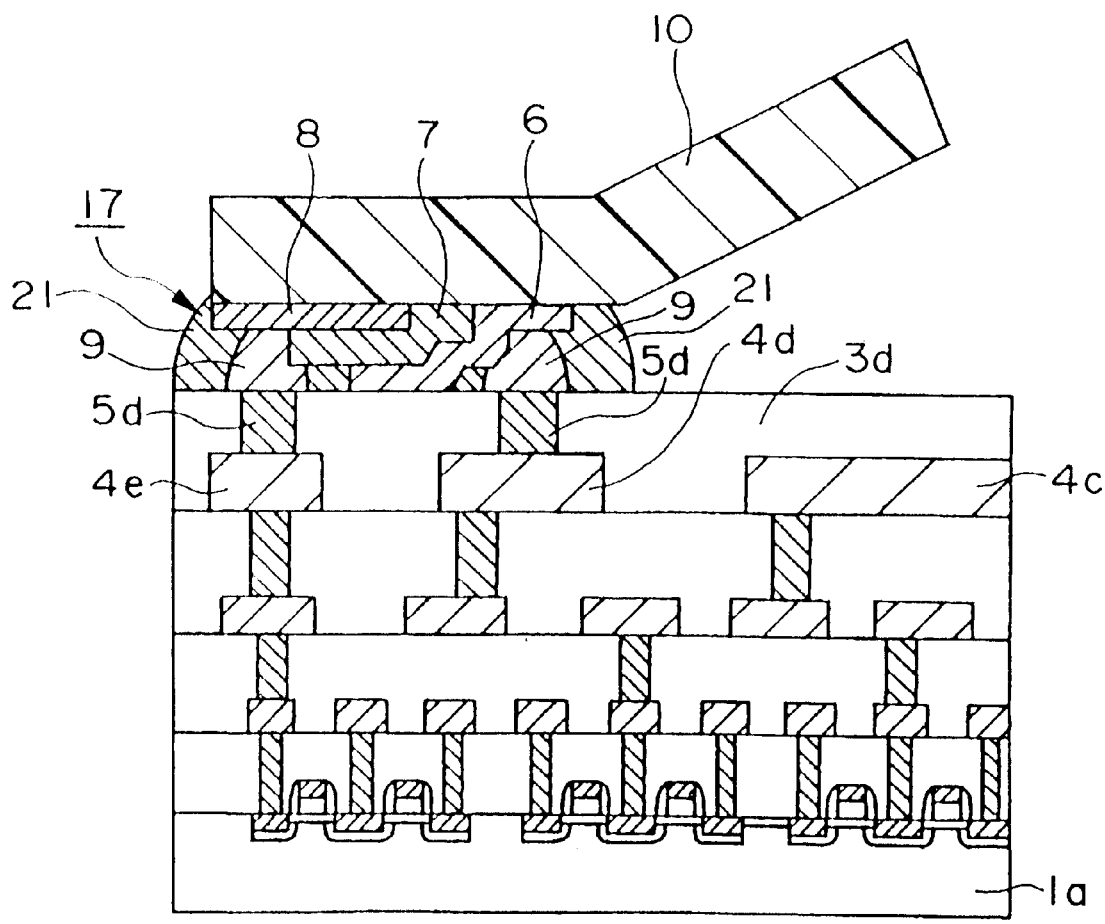

In those sealing structures shown in FIG. 9 and FIG. 10B, the bonding strength between the thin film capacitor 17 and the LSI (on the semiconductor substrate) is increased so that the long-term reliability of the thin film capacitor from the dielectric breakdown is further improved.

In the description of the above-embodiment, although a capacitor comprising a single set of a lower electrode, a dielectric layer, and an upper electrode is described as an example of a thin film capacitor, the present invention is effective for the case using a capacitor composed of a plurality of sets of these layers as the thin film capacitor for the decoupling capacitor. However, since the capacitor comprised of a plurality of sets of layers usually has a larger equivalent series inductance than that of a capacitor composed of a single set of layers, it is preferable to use a thin film capacitor having a single set of layers in order to suppress the source voltage change of the high frequency in the GHz order.

Furthermore, although the LSI formed on a silicon substrate is described as an example of the LSIs in the above embodiments, the present invention is effective for use with LSIs formed on GaAs substrates or other types of substrates. Moreover, although platinum is used for forming electrodes of the thin film capacitor, it is possible to use a Pt/Ti film or a Pt/Mo film for improving the adhesion with the substrate material or for improving the thermal stability.

Furthermore, although a dielectric material of $SrTiO_3$ is used as the high dielectric constant film in this embodiment, various materials having higher dielectric constants than those of $SiO_2$ or $Si_3N_4$ can be used. Examples of materials having high dielectric constants include compounds expressed by the general chemical formula of $ABO_3$, wherein A is at least one element selected from the group consisting of Ba, Sr, Pb, Ca, La, Li, and K; and B is at least one element selected from the group consisting of Zr, Ti, Ta, Nb, Mg, Mn, Fe, Zn, and W. Examples of compounds expressed by $ABO_3$ include, for example, $SrTiO_3$, $PbTiO_3$, $(Pb,La)(Zr,Ti)O_3$, $Pb(Mg,Nb)O_3$, $Pb(MG,W)O_3$, $Pb(Zn,Nb)O_3$, $LiTaO_3$, $LiNbO_3$, $KTaO_3$, and $KNbO_3$. In addition, examples of high dielectric materials include a series of compounds expressed by the chemical formula $(Bi_2O_3)(A_{m-1}B_mO_{3m+1})$ (m=1, 2, 3, 4, 5), wherein A is at least one element selected from the group consisting of Ba, Sr, Pb, Ca, K, and Bi; and B is at least one element selected from the group consisting of Nb, Ta, Ti, and W. Examples of compounds expressed by the formula $(Bi_2O_3)(A_{m-1}B_mO_{3m+1})$ (m=1, 2, 3, 4, 5) include $Bi_4Ti_3O_{12}$, $SrBi_2Ta_2O_9$, and $SrBi_2Nb_2O_9$. In addition, some compounds expressed by other formulas such as $Ta_2O_5$ can be used as the dielectric material for forming the thin film capacitor.

Fifth Embodiment

Figure 11:
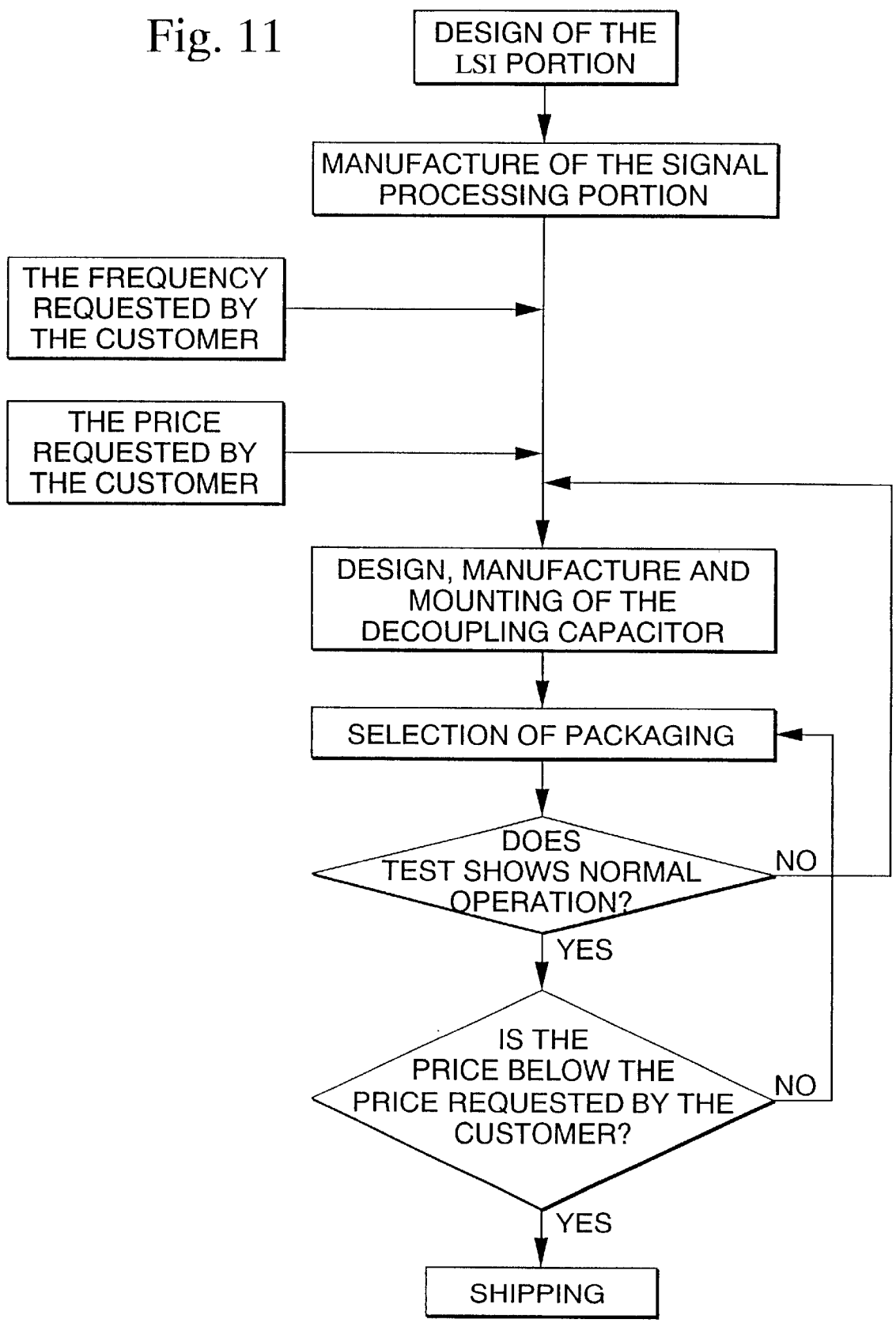
FIG. 11 is a flowchart showing a manufacturing procedure from the design to the delivery of the semiconductor integrated circuit according to the fifth embodiment of the present invention.
Figure 12:
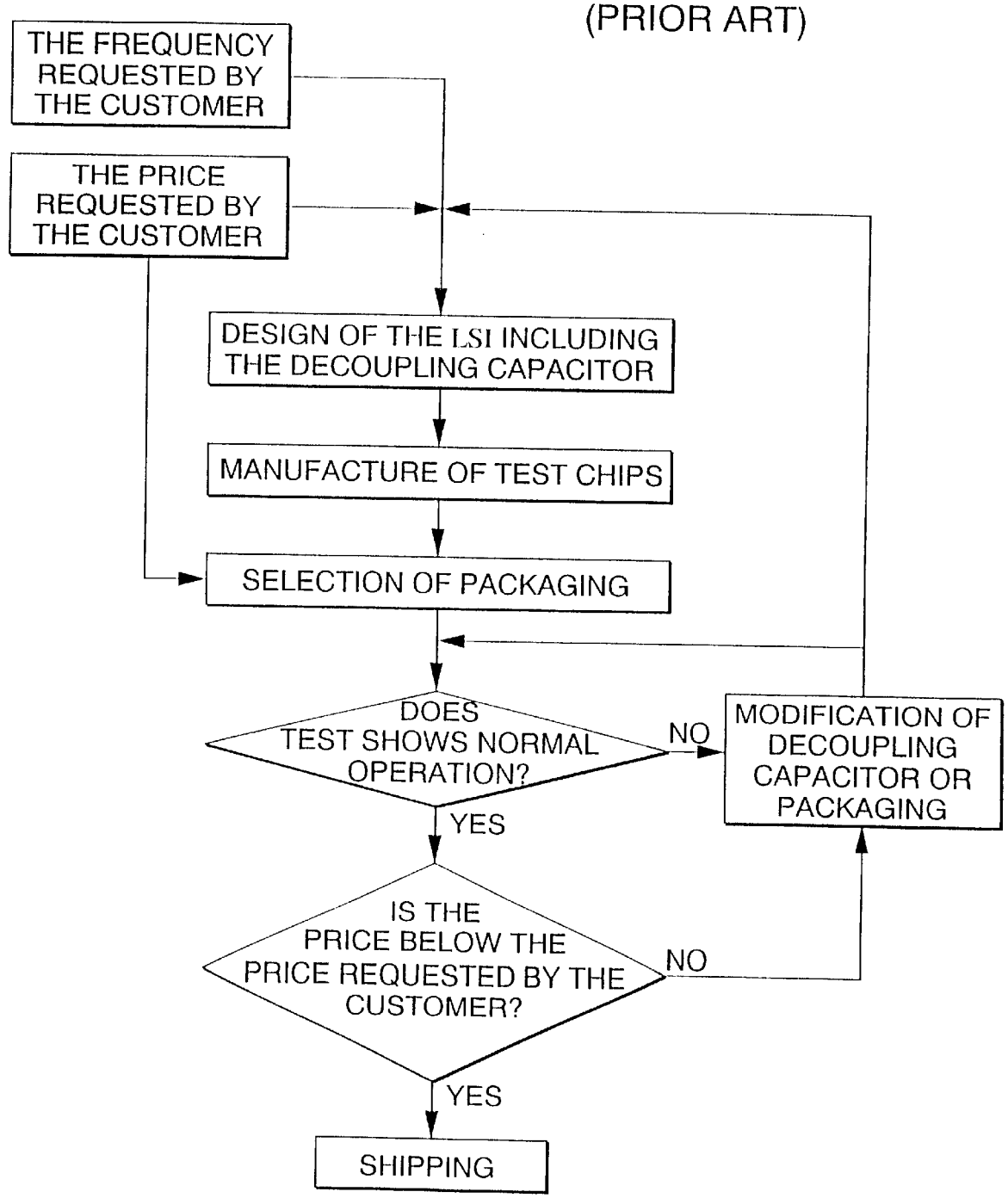
FIG. 12 a flowchart showing a manufacturing procedure from the design to the delivery of a conventional semiconductor integrated circuit.
Figure 13:
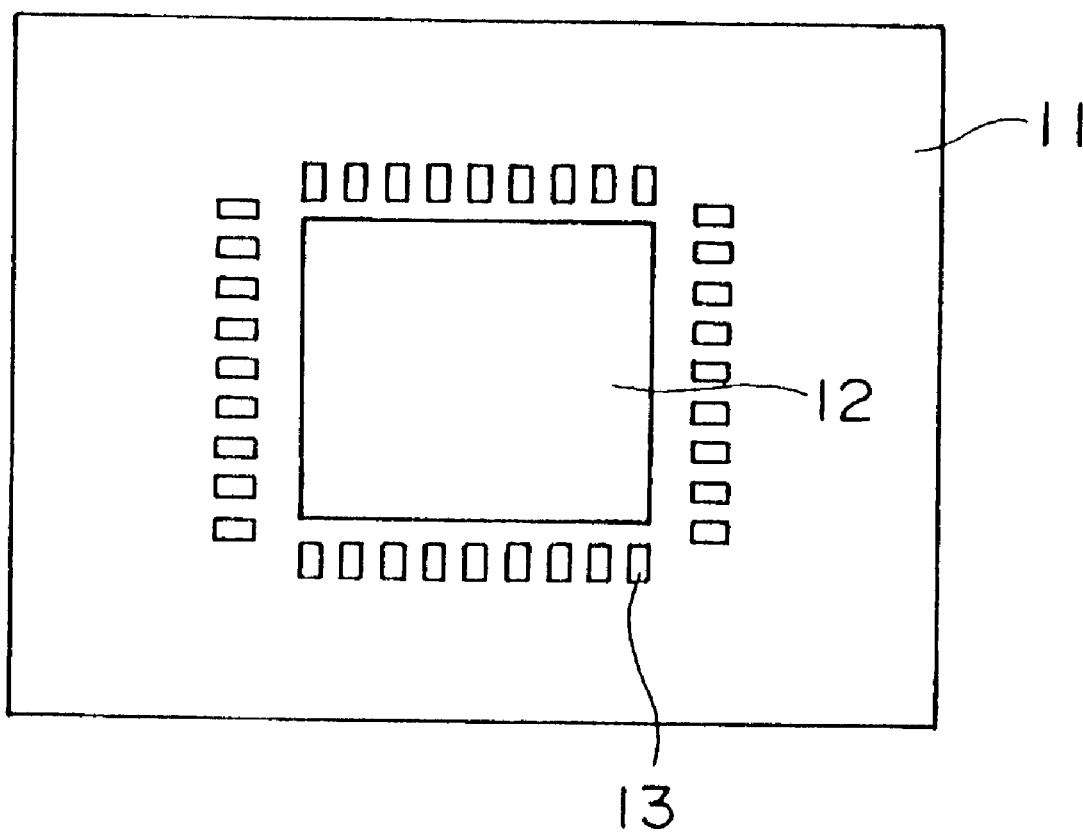
FIG. 13 is a plan view explaining the arrangement of the conventional decoupling capacitors.

FIGS. 11 and 12 show flowcharts explaining the manufacturing procedure from design to delivery of the LSI according to the fifth embodiment.

As shown in FIG. 12, when a manufacturer receives an order for a type of LSI, a type of decoupling capacitor, and a type of decoupling capacitor assembled LSI, the conventional manufacturing procedure starts from the design of the LSI with the decoupling capacitor with reference to the customer's demands about the operating frequency and the price of the product, subsequently produces test samples of the decoupling capacitor assembled LSI, and selects a candidate packaging so as to meet the customer's demand. Subsequently, the manufacturer examines the performances of the test LSI samples with the capacitor, and the tests are repeated while changing the types of the decoupling capacitor and the packaging until the test sample operates normally at a required frequency range. Further tests are repeated until the manufacturer finally confirms that the LSI products can be produced within a price according to the customer's demands.

Such a manufacturing procedure causes problems in that the cost, including that for the test period, becomes high which is reflected in the high price of the product and in that the time from the design to the shipment of the products becomes long. These problems are associated with the recent increase of the operational frequency of the LSI and difficulties in selecting an appropriate decoupling capacitor to be able to guarantee the performance of the devices.

In contrast, the present invention improves the difficulties in the conventional manufacturing procedure. As shown in FIG. 11, the manufacturer designs first a general purpose LSI which can be matched with the operations at a higher frequency range, and produces half-finished products before connecting the decoupling capacitor. The customer inputs to this stage semi-finished LSI product information regarding a desired operational frequency and the desired price through a user terminal connected to a computer network. Based on the customer's information, the manufacturer executes design of the LSI products in terms of selecting an optimum decoupling capacitor and an optimum packaging, and the manufacturer further proceeds production of the LSI products by manufacturing and mounting the decoupling capacitor on the half-finished LSI products and packaging. At this stage, the performance of the LSI products is examined, and if the performance is not good, the decoupling capacitor and the package are again designed for replacement.

As shown in the description of the above embodiment, only the decoupling capacitor and the package are designed for matching to the desired operational frequency. Therefore, it is possible to reduce the manufacturing cost of the LSIs, which occupy a high ratio in the total cost of the capacitor integrated LSI, before integration with the thin film capacitor by use of a general purpose LSI, and it is also possible to deliver the LSI products within a short time.

Note that the scope of the present invention is not limited to the embodiments described above, and that variants thereof can be envisaged without exceeding the spirit of the present invention. For example, it is possible to appropriately change types and numbers integrated in the integrated circuit of the semiconductor device, numbers and the materials of wiring layers, materials of the interlayer insulating films, and the details of methods of each manufacturing process.

As described above, the present invention is capable of controlling the change of the power source voltage within a very short time. The reasons for this art are that, since the dielectric film of the thin film capacitor is very thin and the equivalent series inductance thereof is very small, the thin film capacitor of the present invention operates effectively in the high frequency range, and since the connecting distance between the thin film capacitor and the uppermost wiring layers of the LSI is very short, the parasitic resistance and the parasitic inductance have been reduced. Furthermore, since the capacitor integrated LSI of the present invention can be mounted within a small mounting area on the printed circuit board, it is useful for fabricating small and light-weight electronic apparatuses.

On the other hand, when the upper electrode of the thin film capacitor is not disposed on the contacts for connecting the lower electrode of the thin film capacitor and the LSI, it is possible to control the leak current due to the surface roughness and to increase the storage capacity density by reducing the thickness of the dielectric film.

Furthermore, when a manufacturing method is adopted, in which the thin film capacitor is formed on another silicon substrate or on an organic film separated from the LSI, it is possible to increase the depositing temperature of the dielectric film and to increase the dielectric constant of the dielectric film, and the storage capacity density can be increased. In addition, when the decoupling capacitor is produced on an inexpensive organic film, the cost of the decoupling capacitor can be reduced.

The present invention is effective in reducing the total manufacturing cost of the capacitor integrated LSI and in reducing the delivery time of the same LSI by improving the manufacturing procedure. It is possible to manufacture the capacitor integrated LSIs, capable of being operated at a desired high frequency range by designing the decoupling capacitor and the package and then assembling the decoupling capacitor and the package to the semi-finished LSI products, prepared previously.

What is claimed is:

1. A semiconductor device comprising:
   a plurality of elements formed on a semiconductor substrate;
   an interlayer insulating film covering said plurality of elements;
   a plurality of wiring blocks including a power source wire block and a ground wire block connected to said plurality of elements;
   an uppermost insulating film which covers these wiring blocks; and
   a thin film capacitor formed on said uppermost insulating film; wherein said thin film capacitor comprises at least one set of:
   a lower electrode, which is electrically connected to either one of said power source wire block and said ground wire block through a contact passing through said uppermost insulating film;
   an upper electrode, connected to either one block which is not connected to said lower electrode among said power source wire block and said ground wire block, and at least a portion of said upper electrode extends above said lower electrode; and
   a dielectric layer which is disposed between said lower electrode and said upper electrode.

2. A semiconductor device according to claim 1, wherein said upper electrode is not disposed above the contact, connecting said lower electrode with either one of said power source wire block and said ground wire block.

3. A semiconductor device according to claim 1, wherein said thin film capacitor is constituted by one set of the multilayer structure composed of said lower electrode, said dielectric layer, and said upper electrode.

4. A semiconductor device according to claim 1, wherein at least a part of said dielectric layer includes compounds expressed by the general chemical formula of $ABO_3$, wherein A is at least one element selected from the group consisting of Ba, Sr, Pb, Ca, La, Li, and K; B is at least one element selected from the group consisting of Zr, Ti, Ta, Nb, Mg, Mn, Fe, Zn, and W; or compounds expressed by the chemical formula $(Bi_2O_3)(A_{m-1}B_mO_{3m+1})$ (m=1, 2, 3, 4, 5), wherein A is at least one element selected from the group consisting of Ba, Sr, Pb, Ca, K, and Bi; and B is at least one element selected from the group consisting of Nb, Ta, Ti, and W, or $Ta_2O_5$.

5. A semiconductor device according to claim 1, wherein said thin film capacitor is sealed by a resin.

6. A thin film capacitor which is formed on an uppermost insulating layer of a semiconductor device comprising a plurality of elements, an interlayer insulating film covering said plurality of elements, a plurality of wiring blocks including a power source wire block and a ground wire block, which are electrically connected to said plurality of elements, and an uppermost insulating layer covering the wiring blocks;

wherein, said thin film capacitor is formed by at least one set of a multilayer structure comprised of the lower electrode, the dielectric layer, and the upper electrode comprising:
   a lower electrode which is electrically connected to one of said power source wire block or said ground layer block through a contact which passes through said uppermost insulating layer;
   an upper electrode which is electrically connected to any one of said power source wire block or said ground wire block which is not connected to said lower electrode, and at least a portion of which extends above said lower electrode; and
   a dielectric layer, which is inserted between said lower electrode and said upper electrode.

7. A thin film capacitor according to claim 6, wherein said thin film capacitor is sealed by a resin.

* * * * *